United States Patent
He et al.

(10) Patent No.: US 10,475,940 B2
(45) Date of Patent: Nov. 12, 2019

(54) PACKAGING GLASS WITH HIERARCHICALLY NANOSTRUCTURED SURFACE

(71) Applicant: King Abdullah University of Science and Technology, Thuwal (SA)

(72) Inventors: Jr-Hau He, Thuwal (SA); Hui-Chun Fu, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/073,087

(22) PCT Filed: Jan. 26, 2017

(86) PCT No.: PCT/IB2017/050426
§ 371 (c)(1),
(2) Date: Jul. 26, 2018

(87) PCT Pub. No.: WO2017/130139
PCT Pub. Date: Aug. 3, 2017

(65) Prior Publication Data
US 2019/0044004 A1 Feb. 7, 2019

Related U.S. Application Data

(60) Provisional application No. 62/287,172, filed on Jan. 26, 2016.

(51) Int. Cl.
*H01L 31/00* (2006.01)
*H01L 31/0236* (2006.01)
(Continued)

(52) U.S. Cl.
CPC .. *H01L 31/02366* (2013.01); *H01L 31/02168* (2013.01); *H01L 31/0547* (2014.12);
(Continued)

(58) Field of Classification Search
CPC ........ H01L 31/02366; H01L 31/02168; G02B 2207/101; B82Y 20/00; B82Y 30/00
See application file for complete search history.

(56) References Cited

U.S. PATENT DOCUMENTS

2009/0188544 A1* 7/2009 Kobayashi ............. B82Y 20/00
136/244
2013/0153860 A1* 6/2013 Kim .................... H01L 51/0002
257/14
2014/0295208 A1* 10/2014 Fan ................... H01L 31/02366
428/606

FOREIGN PATENT DOCUMENTS

WO 2009001103 A1 12/2008
WO 2011062791 A2 5/2011
(Continued)

OTHER PUBLICATIONS

Notification of Transmittal of the International Search Report and the Written Opinion of the International Searching Authority, or the Declaration for PCT/IB2017/050426 dated Mar. 27, 2017.
(Continued)

*Primary Examiner* — Angelo Trivisonno
(74) *Attorney, Agent, or Firm* — Billion & Armitage; Michael A. Collins

(57) ABSTRACT

An optical device includes an active region and packaging glass located on top of the active region. A top surface of the packaging glass includes hierarchical nanostructures comprised of honeycombed nanowalls (HNWs) and nanorod (NR) structures extending from the HNWs.

16 Claims, 15 Drawing Sheets

(51) Int. Cl.
- H02S 40/10 (2014.01)
- H02S 40/44 (2014.01)
- H01L 31/054 (2014.01)
- H01L 31/0216 (2014.01)
- H01L 31/18 (2006.01)
- B82Y 20/00 (2011.01)
- B82Y 30/00 (2011.01)
- B82Y 40/00 (2011.01)

(52) U.S. Cl.
CPC .............. *H01L 31/18* (2013.01); *H02S 40/10* (2014.12); *H02S 40/44* (2014.12); *B82Y 20/00* (2013.01); *B82Y 30/00* (2013.01); *B82Y 40/00* (2013.01); *G02B 2207/101* (2013.01); *Y02E 10/50* (2013.01)

(56) References Cited

FOREIGN PATENT DOCUMENTS

| WO | 2013160570 A1 | 10/2013 |
|----|---------------|---------|
| WO | 2015074601 A1 | 5/2015  |

OTHER PUBLICATIONS

Chia-Yang, et al., "Supersensitive, Ultrafast, and Broad-Band Light-Harvesting Scheme Employing Carbon Nanotube/TiO2 Core-Shell Nanowire Geometry", ACS Nano, 2012, 6687-6692.

Chin-An, et al., "An efficient broadband and omnidirectional light-harvesting scheme employing a hierarchical structure based on a ZnO nanorod/Si3N4-coated Si microgroove on 5-inch single crystalline Si solar cells", Nanoscale, The Royal Society of Chemistry, 2012, 6520-6526.

Der-Hsien, et al., "Engineering Light Outcoupling in 2D Materials", Nano Letters; American Chemical Publications, Society 2015, 1356-1361.

Po-Han, et al., "Enhanced light extraction of light-emitting diodes via nano-honeycomb photonic crystals", Nano-honeycomb 79 photonic crystals, 2014, 78-83.

Siu-Fung, et al., "Light Management with Nanostructures for Optoelectronic Devices", The Journal Physical Chemistry Letters, 2014, 1479-1495.

Yi-Ruei, et al., "Surface profile-controlled close-packed Si nanorod arrays for self-cleaning antireflection coatings", Journal of Applied Physics, 2009, 114310/1-114310/4.

Yu-An, et al., "Subwavelength Si nanowire arrays for self-cleaning antireflection coatings", The Royal Society of 10924-10930, 2010.

Dai, Yu-An, et al., Subwavelength Si nanowire arrays for self-cleaning antireflection coatings, Journal of Materials Chemistry, 20 10924-10930 2010.

Fu, Po-Han, et al., Enhanced lightextraction of light-emitting diodes via nano-honeycombphotoniccrystals, Nano Energy, 8 78-83, Jun. 9, 2014.

Hsu, Chia-Yang, et al., Supersensitive, Ultrafast, and Broad-Band Light-Harvesting Scheme Employing Carbon Nanotube/TiO2 CoreShell, Nanowire Geometry ACS Nano, vol. 6, No. 8., 6687-6692, Aug. 15, 2012.

Leung, Siu-Fung, et al., Light Management with Nanostructures for Optoelectronic Devices, J. Phys. Chem. Lett., 5, 1479-1495, Apr. 3, 2014.

Lien, Der-Hsien, et al., Engineering Light Outcoupling in 2D Materials, Nano Lett., 15, 1356-1361, Jan. 20, 2015.

Lin, Yi-Ruei, et al., Surface profile-controlled close-packed Si nanorod arrays for self-cleaning antireflection coatings, Journal of Applied Physics, 106, doi: 10.1063/1.3267147, 114310-1-114310-4, Dec. 4, 2009.

\* cited by examiner

PACKAGING GLASS WITH HIERARCHICALLY NANOSTRUCTURED SURFACE

TECHNICAL FIELD

The present disclosure is related nanostructure surface nanostructure designs for use in optical devices, and in particular to nanostructures designed to significantly suppress the reflectance and efficiently enhance light propagation length of guided mode couplings in a wide range of wavelengths.

BACKGROUND

The term "optical device" refers to a broad range of devices that require control and/or manipulation of light, including those utilized in photovoltaics, light emission, photo-detection, and photo-catalysis. In many of these applications, the optical device is protected or enclosed in packaging glass that acts not only to protect the active region of the optical device, but to efficiently transmit light to or from the active region. Optical packaging glass has a relatively low refractive index, and is therefore a good choice for protecting/encasing the active regions of optical devices as light is allowed to travel relatively freely through the packaging glass. Typically, packaging glass would have a flat or planar surface. However, somewhat counterintuitively, a flat surface does not provide the best performance. In particular, a flat surface has several drawbacks including relatively high reflection rates (i.e., light incident to the surface is reflected back away from the active region of the optical device) and relatively low self-cleaning capabilities (e.g., particles adhere relatively easily to the flat surface structure, resulting in obscuration of light incident to the surface of the packaging glass.

For example, in solar cell applications, it is important for the packaging glass selected to transmit a high percentage of the incident sunlight to the active region of the solar cell (i.e, low reflectivity). In addition, because solar cells are used outdoors over extended periods of time, it is important for the surface of the packaging glass to provide good self-cleaning capabilities in order to reduce the amount of dust/particles that adhere to the surface of the packaging glass. This is particularly important for applications in which the solar cell will be utilized in dusty/polluted areas.

DETAILED DESCRIPTION

Optical devices typically employ packaging glass located over the top of the active region of the optical device, both to protect the active region and to provide efficient transmission of incident light (e.g., sunlight) to the active region. The present disclosure utilizes hierarchical nanostructures fabricated on the surface of the packaging glass, which acts to reduce reflections of the incident light, increase light transmitted to the active region, and increase the self-cleaning capabilities of the optical device as compared with bare packaging glass (i.e., no surface structure) and other types of surface structures. The present disclosure is described with respect to solar cell applications, but may be utilized in other applications in which one or more of low reflectivity/good transmittance, wide range of incidence angles, and good self-cleaning capabilities are important characteristics. With respect to solar cells, all three are important attributes, which makes the present invention particularly useful to solar cell applications.

Figure 1:
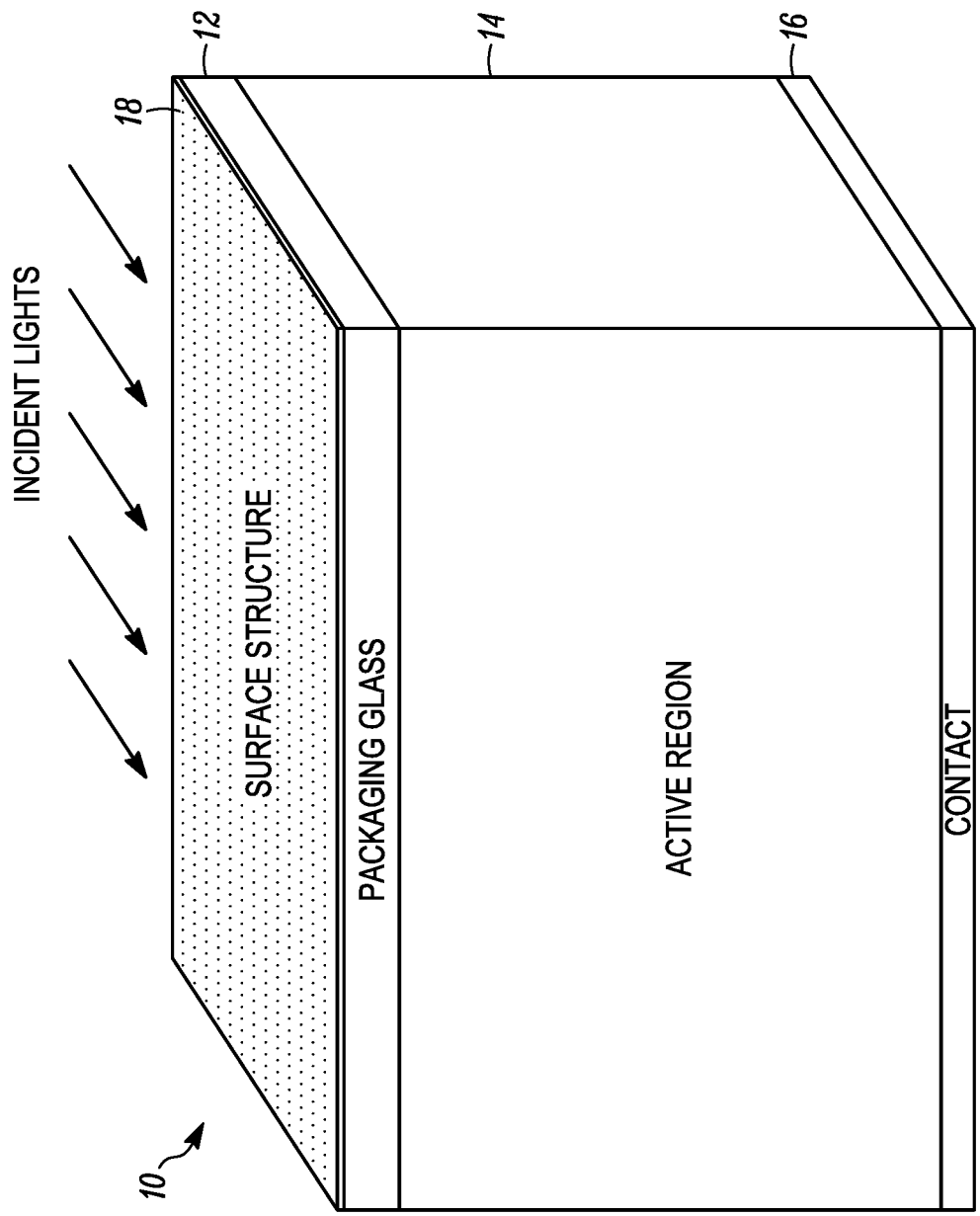
FIG. 1 is a perspective cross-sectional view of an optical device that includes a packaging glass substrate having a nanostructured surface that reduces reflectivity and provides superior self-cleaning attributes according to an embodiment of the present invention.

FIG. 1 is a perspective cross-sectional view of optical device 10 that includes a packaging glass substrate 12 having a nanostructured surface that reduces reflectivity and provides superior self-cleaning attributes according to an embodiment of the present invention. In particular, optical device 10 includes packaging glass 12, active region 14, and contact layer 16. The surface of packaging glass 12 includes a hierarchical nanostructure 18, discussed in more detail with respect to FIG. 2. Light incident on packaging glass layer 12 is communicated to active region 14. In applications in which optical device 10 is a solar cell, active region 14 includes one or more silicon layers configured to convert incident solar energy to electrical energy. In this type of application, active region 14 may be comprised of a variety of different materials, including semiconductor materials (such as crystalline silicon, polysilicon, monocrystalline silicon), thin films (such as amorphous silicon, cadmium telluride (CdTe), copper indium gallium selenide (CIGS), silicon thin film, and gallium arsenide thin film), and multi-junction cells.

The purpose of packaging glass 12 is to protect active region 14 while transmitting incident light as efficiently as possible to active region 14. The hierarchical nanostructures fabricated on the top surface of packaging glass 12 modifies the air/packaging glass interface, providing for improved transmission (i.e., less reflectance) of incident light at various angles while also providing good self-cleaning capabilities. For applications in which optical device 10 is a solar cell, efficient transmission of incident light to the active region 14 improves the overall power conversion efficiency (PCE) of the device. In addition to providing efficient transmission (i.e., reduction in reflections), the hierarchical nanostructure 18 increases the angle of incident light that may be successfully transmitted to the active region 14, thereby obviating the need for costly tracking systems utilized to modify the position of the solar cell depending on the location of the sun. Finally, the hierarchical nanostructure minimizes the surface contact area of packaging glass 12. The minimized surface contact area provides improved hydrophobicity, which means that the packaging glass 12 will provide good self-cleaning characteristics.

Figure 2:
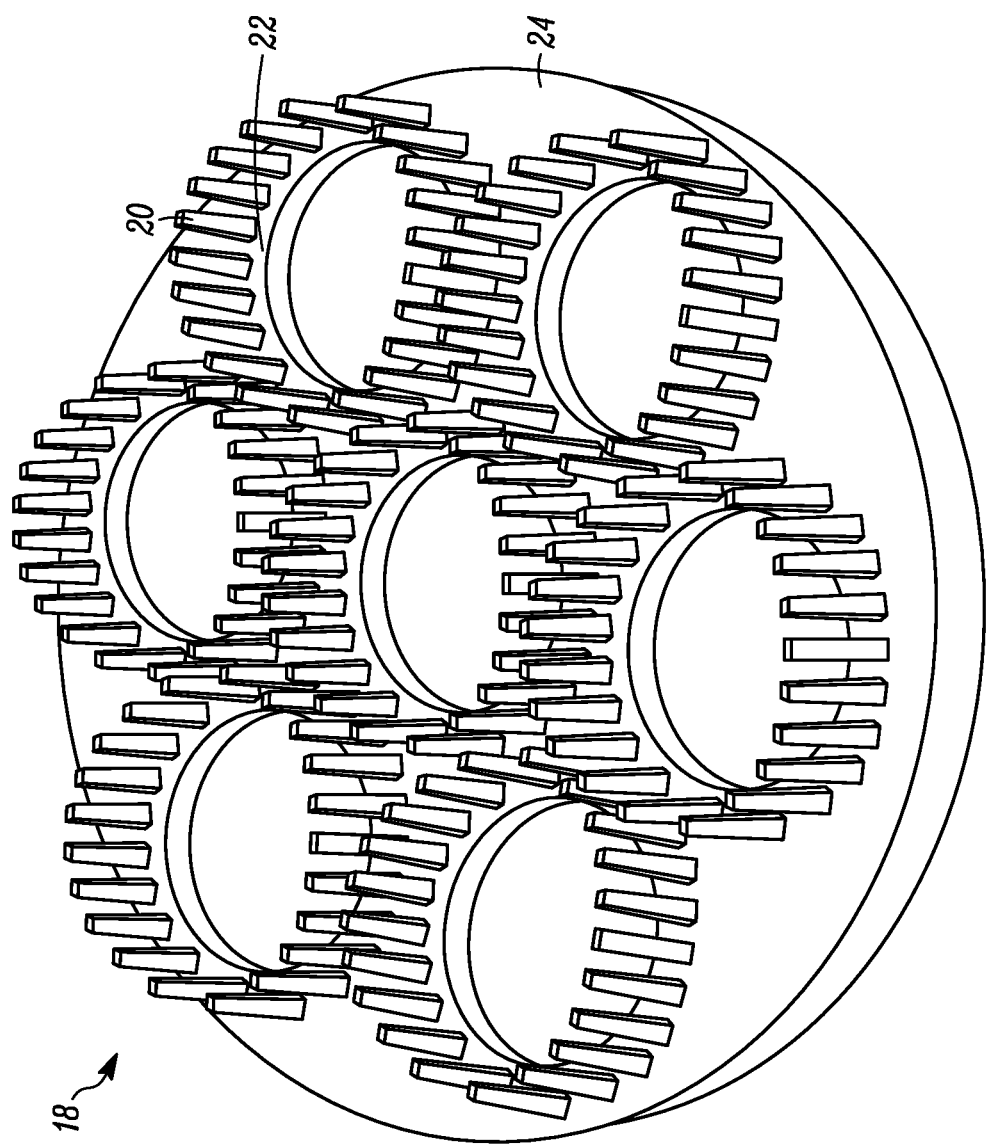
FIG. 2 is a perspective view of a hierarchical nanostructure surface fabricated on the top surface of the packaging glass substrate according to an embodiment of the present invention.

FIG. 2 is a perspective view of packaging glass 12 that illustrates the geometry of the hierarchical nanostructure 18 according to an embodiment of the present invention. Hierarchical nanostructure 18 includes both nanorod (NR) structures 20 and honeycomb nanowalls (HNWs) 22. These nanostructures are fabricated from packaging glass substrate 24, which in one embodiment is comprised of fused silicon dioxide ($SiO_2$). In one embodiment, lithographic processes are utilized to fabricate the hierarchical structures on the surface of packaging glass substrate. The NR structure 20 and HNWs 22 form an air/nanostructure interface, the effects of which are described in more detail below.

In the embodiment shown in FIG. 2, NR structures 20 have a rod-like shape, with a proximal end affixed or attached to the HNWs 22 and a distal end that extends away from the HNWs 22 (i.e., away from the surface of packaging glass 12). In the embodiment shown in FIG. 2, the distal end of NR structures 20 is tapered slightly. As the name suggests, honeycomb nanowalls (HNWs) 22 include a plurality of nanowall structures that form a honeycomb pattern on the surface of packaging glass 12. NR structures 20 extend from the top of each HNW 22. If fabricated from the packaging glass substrate, NR structure 20 and HNWs 22 will be comprised of the same material as packaging glass 12, such as $SiO_2$. In one embodiment, the combined height of HNWs 22 and NR structures 20 is approximately 470 nanometers (nm), although it other embodiments this height may be adjusted.

The combination of NR structures 20 and HNWs 22 provide a number of benefits over a bare (i.e., flat) packaging glass surface, as well as over other nanostructured surfaces such as those employing only nanorod (NR) structures or only honeycomb nanowalls (HNWs). In particular, the NR structures 20 provides a smooth index transition from the air to the packaging glass in order to minimize reflections at the interface between the air and the packaging glass (i.e., the air/nanostructure interface). HNWs 22 function to create an effective scattering angle into packaging glass substrate 24. In this way, the combination of the NR structures 20 and HNWs 22 reduce reflections (i.e., anti-reflection properties) but also expand the range of incident angles that can be utilized. In addition, the combination of NR structures 20 and HNWs 22 provide a surface with superior self-cleaning abilities. In the context of solar panels, the term self-cleaning refers to the ability of the solar panel to prevent particles such as dust or sand from resting on the solar panel. A measure of the self-cleaning ability of a particle structure or material is related to the "hydrophobicity" of the material, which is a measure of the lack of attraction between the material or surface and a droplet of water. Hierarchical structure 18 provides a reduced contact area on the nanostructured surface that prevents particles/dust from becoming adhered to the surface of packaging glass 12. In this way, utilizing hierarchical nanostructure 18 on the surface of packaging glass 12 provides substantial benefits for long-term use of solar cells, particularly in locations suffering from significant pollution/dust issues.

Figure 3A:
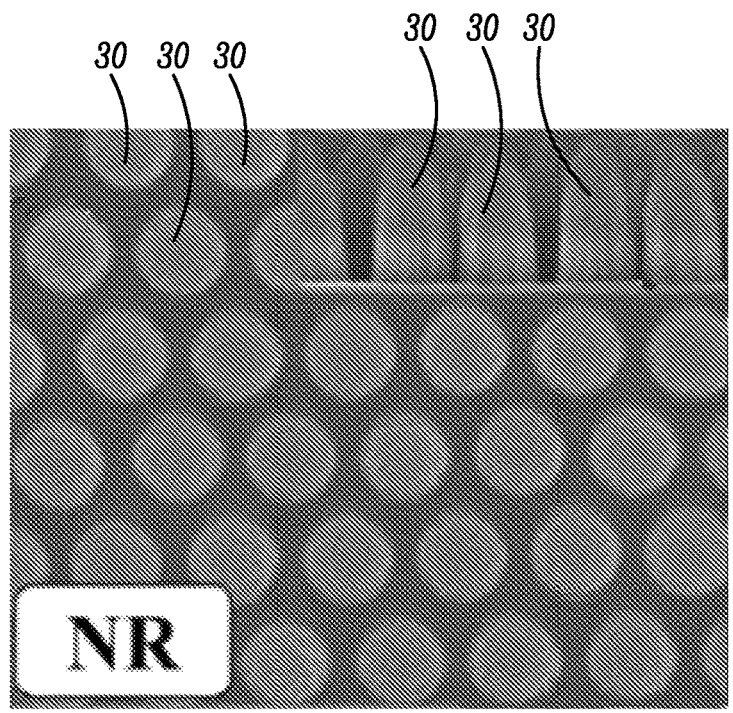
FIG. 3a is a scanning electron microscope (SEM) top view of a nanorod (NR) only structure fabricated on a top surface of the packaging glass as known in the prior art.
Figure 3B:
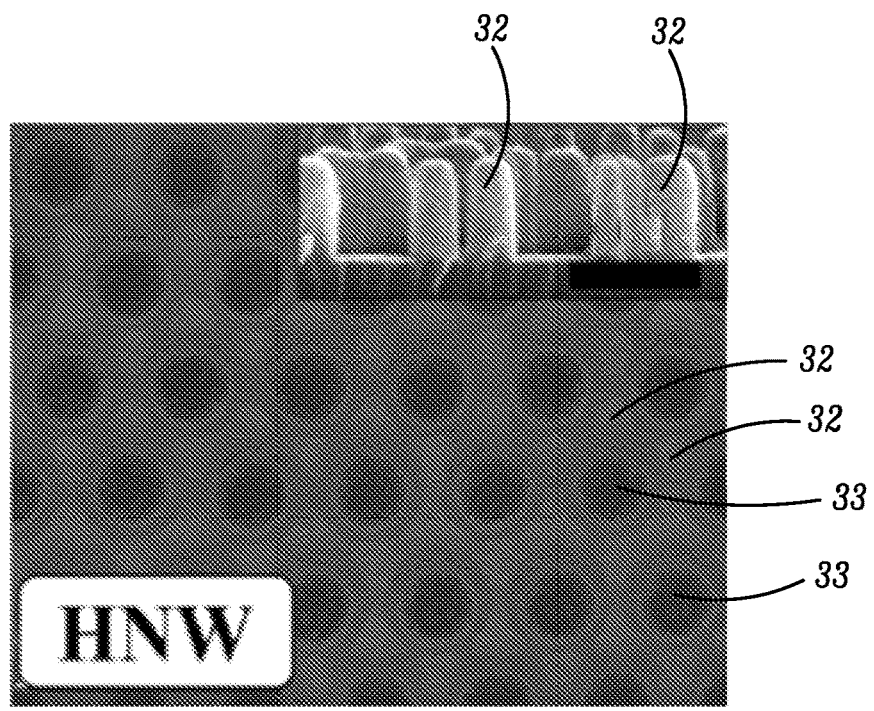
FIG. 3b is a SEM top view of a honeycomb nanowall (HNW) only structure fabricated on a top surface of the packaging glass as known in the prior art.
Figure 3C:
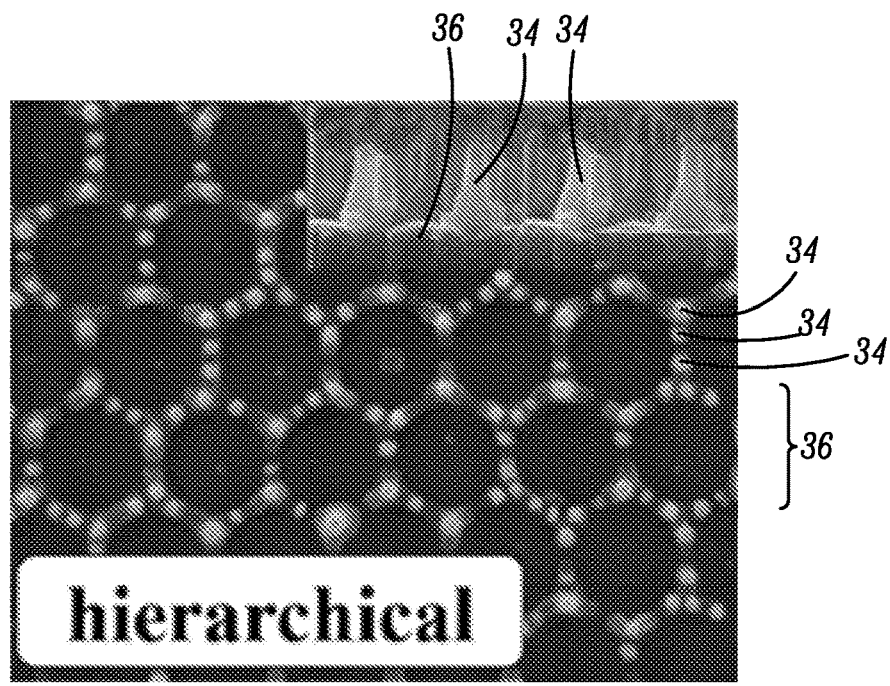
FIG. 3c is a SEM top view of a hierarchical nanostructure fabricated on a top surface of the packaging glass according to an embodiment of the present invention.

FIGS. 3a-c are scanning electron microscope (SEM) top views that illustrate a nanorod (NR) structures 30, a honeycomb nanowall (HNW) structure 32, and a hierarchical structure that includes NR structures 34 constructed on top of HNW structures 36 according to an embodiment of the present invention. An inset within each image shows a cross-sectional view of the respective nanostructures associated with each type of structure.

FIG. 3a illustrates a plurality of nanorods 30, each having a circular shape shown in the top view. In the embodiment shown in FIG. 3a, the height of each nanorod structure 30 is greater than the diameter of each structure. For example, in the embodiment shown in FIG. 3a the diameter of each nanorod 30 is approximately 250 nanometers (nm), while the height of each nanorod 30 (shown in the cross-sectional inset) is approximately 510 nanometers. In addition, the cross-sectional inset illustrates the tapered tips of each nanorod 30. FIG. 3b illustrates a plurality of nanowall structures 32 organized into a honeycomb-like structure, wherein the circular shapes 33 represent the area between nanowalls. The cross-sectional inset shown in FIG. 3b illustrates that each nanowall has a height of approximately 480 nm, and a thickness of approximately 200 nm.

FIG. 3c illustrates a hierarchical nanostructure that includes a plurality of NR structures 34 constructed on top of HNW structures 36 according to an embodiment of the present invention. In the top view, the HNW structures 36 are clearly visible forming the characteristic honeycomb shape. The NR structures 34 are located on top of the HNW structures 36, and are characterized by a circular shape. NR structures 34 are distributed evenly along the top of the HNW structures 36, as represented by the lighter shade dots. In one example, approximately ten to twelve NR structures 34 are located on the perimeter of each honeycomb portion.

As illustrated in the cross-sectional inset, the height of the hierarchical structure (which includes the height of the HNW structures 36 and the NR structures 34 formed on top of the HNW structures 36) is approximately 470 nm. However, it should be understood that these dimensions made be modified depending on the application.

Figure 4A:
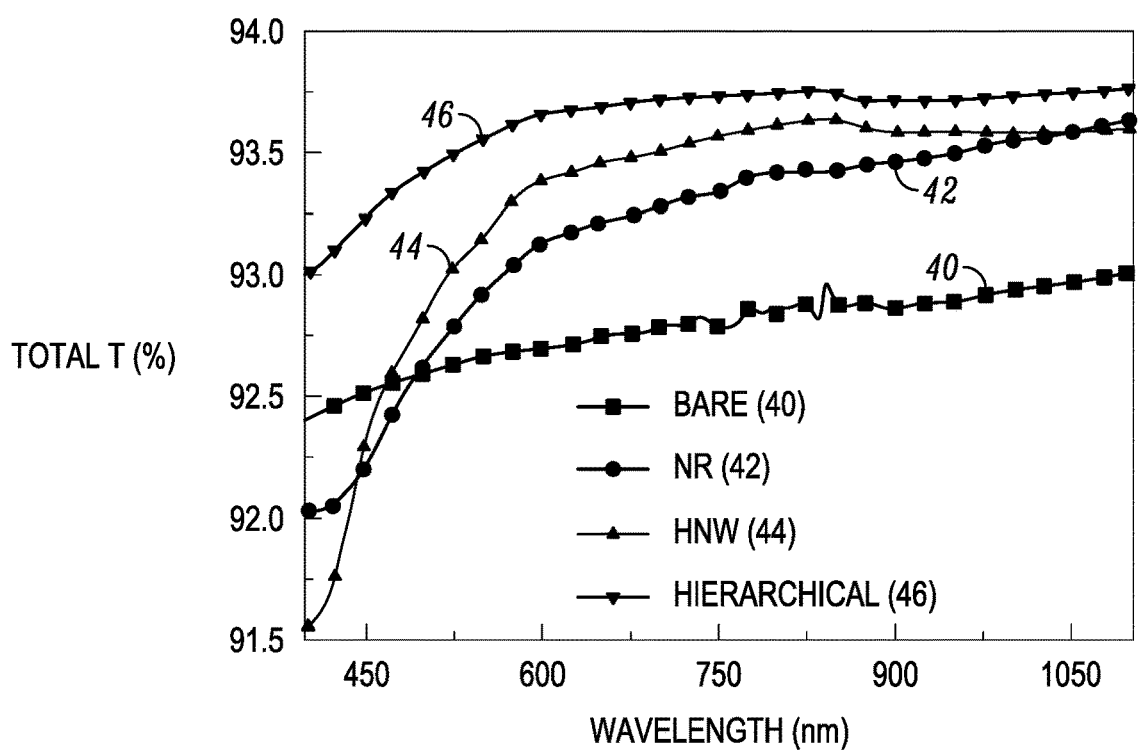
FIGS. 4a and 4b are graphs illustrating the improvement in total optical transmittance and optical haze, respectively, provided by the hierarchical nanostructure as compared with other types of surface structures.
Figure 4B:
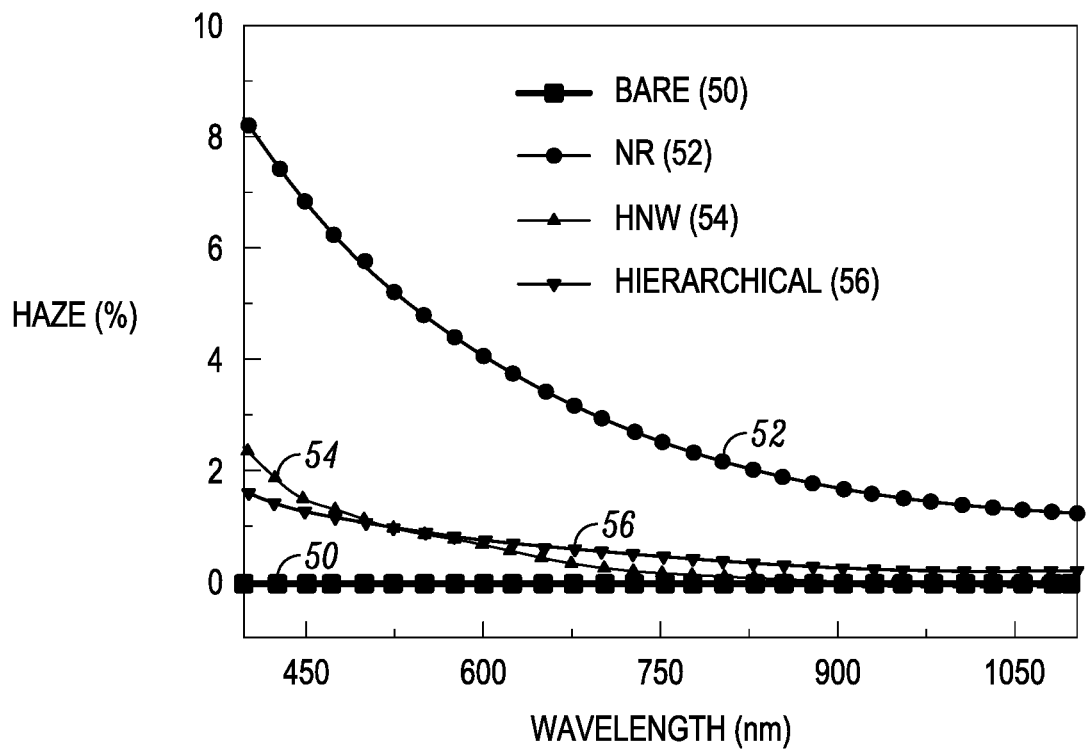

FIGS. 4a and 4b are graphs illustrating the improvement in total optical transmittance and optical haze, respectively, provided by the hierarchical nanostructure as compared with other types of surface structures over a range of wavelengths extending from 450 nm to 1100 nm.

Optical transmittance T refers to the percentage of light incident on packaging glass 12 that is communicated or transmitted to the active region 14 (as shown in FIG. 1), wherein higher optical transmittance T percentages are more desirable. In this way, optical transmittance T is related to the reflectivity of packaging glass 12 (as shown in FIG. 1), wherein higher reflectivity results in lower optical transmittance T. Optical haze is defined as the ratio of diffused transmittance to the total optical transmittance.

With respect to FIG. 4a, line 40 represents the total optical transmittance (y-axis) obtained using a bare or flat packaging glass at various wavelengths of light (x-axis). Line 42 represents the performance obtained using only NR structures; line 44 represents the performance obtained using only HNW structures; and line 46 represents the performance obtained using a hierarchical nanostructure that includes NR structures formed on top of HNW structures according to an embodiment of the present invention.

As illustrated in FIG. 4a, total optical transmittance T is higher for NR only structures (line 42) and HNW only structures (line 44) at wavelengths above 470 nm and 506 nm, respectively, as compared with the total optical transmittance for a bare or planar packaging glass (i.e., no structure). However, at shorter wavelengths the total optical transmittance for NR only structures and HNW only structures are lower than that provided by bare packaging glass (line 40) as a result of the strong reflective scattering of these wavelengths by the NR structures and HNW structures. That is, the geometrical features of the NR only structure and HNW only structures become increasingly resolved by the decreased wavelength, leading to a pronounced scattering effect and therefore decreased total transmittance.

In contrast, the total optical transmittance associated with the hierarchical structure (line 46) is superior to the other structures within the entire range of wavelengths (e.g., 450 nm to 1100 nm). This improved performance as compared with other types of surface structures can be attributed to several factors. For wavelengths greater in length than the geometric size of the NR structures 34 (shown in FIG. 3c) employed in the hierarchical structure, the reduced reflectance (and therefore increased transmittance) is attributable to the effective medium theory, wherein the subwavelength dimensions of the nanorods make the structure behave like an effective medium whose effective refractive index smoothly changes from 1 (refraction index of air) to 1.55 (refraction index of $SiO_2$). As the incident light is reflected by the hierarchical nanostructures, the suppression of the reflected waves occurs through destructive interference, where the waves with different phases partially (or wholly) cancel one another out. However, at shorter wavelengths (i.e., wavelengths comparable in length to the dimension/geometric size of the nanostructure) the reflectance is reduced through the resonance and/or scattering effect. In particular, when light impinges on the bottom of HNW structures 36 (shown in FIG. 2), strong optical scattering can take place around the air/HNW interface, leading to prolonged optical paths on the surface and thus increasing the chances of light penetration into the active region 14 (shown in FIG. 1). The combined effect of effective medium reflection by the NR structures 34 and light trapping by the HNWs 36 (as shown in FIG. 3C) leads to the highest transmittance at every wavelength being demonstrated by the hierarchical nanostructure.

With respect to FIG. 4b, line 50 represents the haze spectra (y-axis) obtained using a bare or flat packaging glass at various wavelengths of light (x-axis). Line 52 represents the performance obtained using NR only structure; line 54 represents the performance obtained using a HNW only structure; and line 56 represents the performance obtained using a hierarchical nanostructure that includes NR structures 34 formed on top of HNW structures 36 (as shown in FIG. 3c) according to an embodiment of the present invention. To extract the maximize amount of photocurrent from a solar cell, it is desirable to maximize the haze percentage without sacrificing total transmittance. That is, a surface with proper haze enhancement will improve optical absorption of the solar cell via the aforementioned scattering effect. However, it should be noted that a high haze value does not guarantee a high current density ($J_{SC}$), as a high haze value may be caused by severe reflective scattering, which would decrease the total transmittance. For example, FIG. 2b illustrates a high haze percentage for the NR only structure (line 52) at relatively low wavelengths (e.g., 450-600 nm), yet the total transmittance for the NR only structure at these wavelengths (as shown in FIG. 4a) is relatively low even as compared to the planar packaging glass structure (line 50).

With respect to the packaging glass embodiments that utilize nanostructures, FIG. 4b illustrates that the haze percentage gradually decays as the wavelength increases, which is attributable to the fact that the nanostructures associated with each surface structure have geometries less than approximately 500 nm. This is attributable to the fact that as the wavelength increases beyond the geometric size of the nanostructures (including NR only structures, HNW only structures, and hierarchical structures), the surface features become less resolved, resulting in a decreased scattering effect and thus a reduced haze ratio. FIG. 4b illustrates that the hierarchical structure (line 56) has a higher haze ratio than bare packaging glass (line 50), and has a comparable haze ratio to the HNW structure (line 54).

Figure 5A:
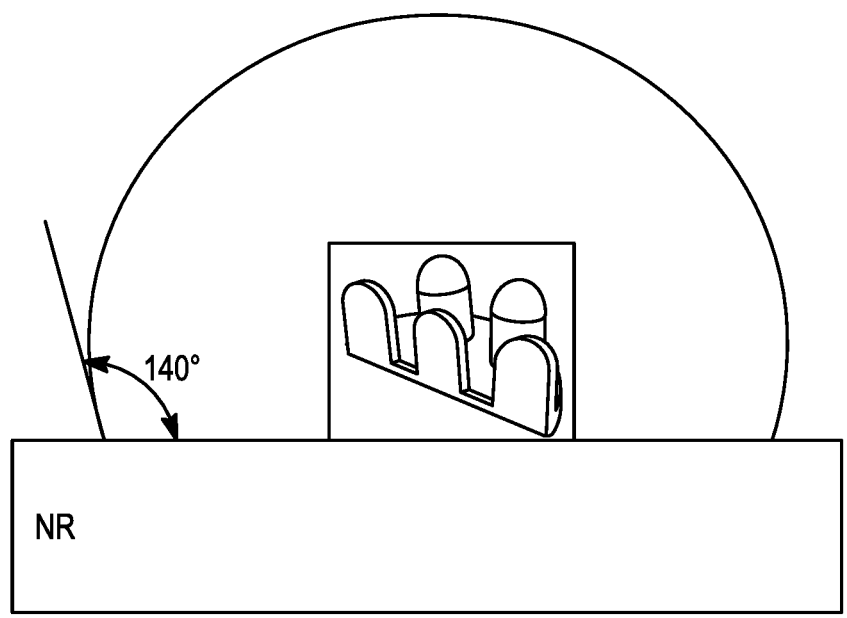
FIGS. 5a-5d are side views illustrating the improved hydrophobicity achieved with the hierarchical nanostructure surface as compared with other types of surface structures.
Figure 5B:
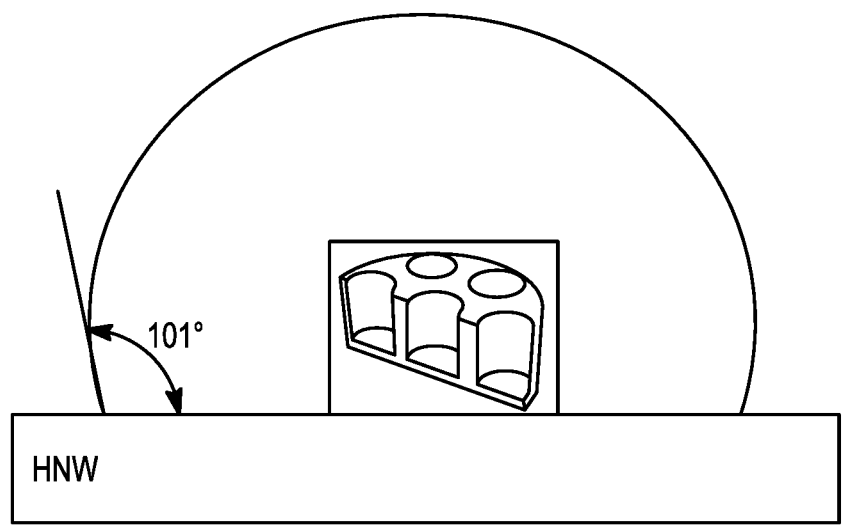
Figure 5C:
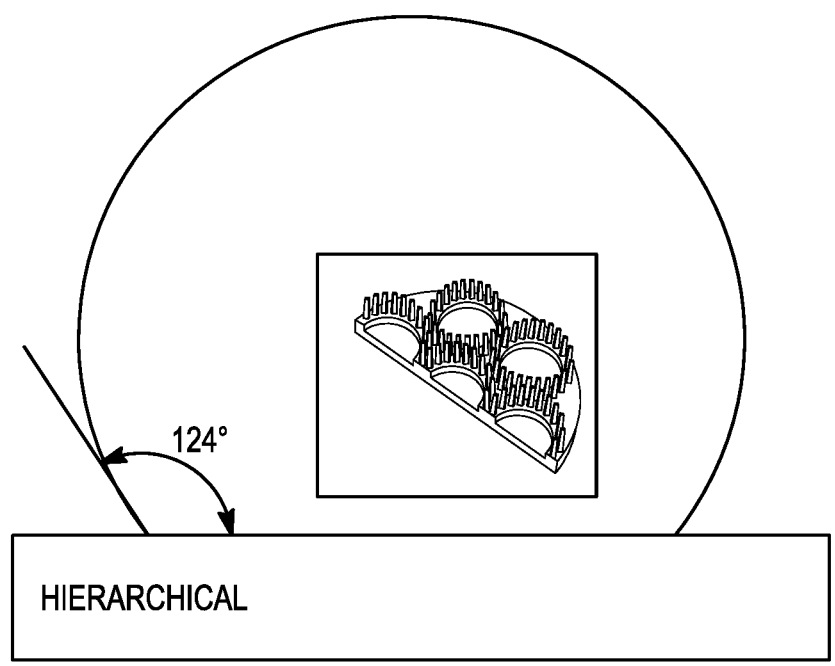
Figure 5D:
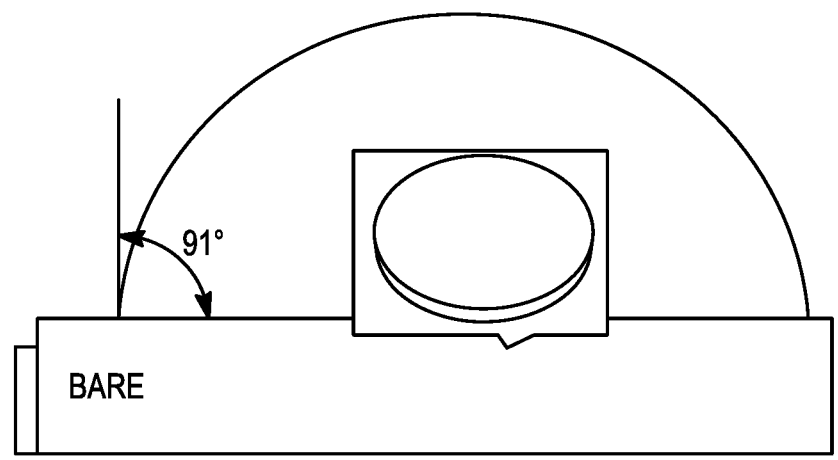

FIGS. 5a-5d are photographic images illustrating the hydrophobicity of various structures, including the hierarchical nanostructure provided according to an embodiment of the present invention. As discussed above, hydrophobicity is related to the ability of the packaging glass to be self-cleaning (i.e., repel or prevent particles such as dust particles from adhering to the surface of the packaging glass and interfering with incident light). Packaging glass exhibiting good self-cleaning attributes will exhibit better performance (such as high total transmittance and high short-circuit current density $J_{SC}$) over long periods of time. To measure the self-cleaning attributes of the various surface structures shown in FIGS. 3a-3c, water droplets were deposited onto the respective surfaces using the sessile drop method, and the resulting contact angle created between the droplet and the packaging glass surface were measured. The larger the contact angle, the greater the hydrophobicity of the respective surface. In particular, FIG. 5a illustrates the resulting contact angle associated with a surface structure comprised of nanorod (NR) only structures; FIG. 5b illustrates the resulting contact angle associated with a surface structure comprised of only honeycomb nanowalls (HNW); FIG. 5c illustrates the resulting contact angle associated with a surface structure comprised of a hierarchical surface structure; and FIG. 5d illustrates the resulting contact angle associated with a surface structure comprised of a planar or flat surface.

The contact angle for the planar surface (shown in FIG. 5d) illustrates the smallest contact angle (approximately 910), and as a result the droplet is well-adhered to the surface of the packaging glass. The contact angle is increased by utilizing HNW only structures (shown in FIG. 5b, having a contact angle of 101°) and NR only structures (shown in FIG. 5a, having a contact angle of 104°). However, the hierarchical nanostructure exhibits the best performance, providing a contact angle of 124°. As a result, the hierarchical nanostructure exhibits the best self-cleaning attributes of the various packaging glass surfaces.

The specific mechanism that determines hydrophobic behavior is represented by Cassie's equation:

$$\cos \theta_w = w \cos \theta_y - (1-w) \quad \text{Eq. 1}$$

wherein $\theta_w$, (90°<$\theta_w$<180° for a hydrophobic surface) is the measured contact angle on the structured surface, $\theta_y$ is the intrinsic contact angle on a bare surface, and w and (1−w) are the fractions of the water/solid interface and water/air interface at the contact surface, respectively. The contact areas of water droplets are dependent on the filling fraction of the surface structures, which can be estimated from the SEM images shown in FIGS. 3a-3c. For example, the fill fractions of NR only structures, HNW only structures, and hierarchical surfaces shown in FIGS. 3a-3c, respectively, are 0.47, 0.54 and 0.08, respectively. With respect to the hierarchical structure, the NR structures 34 (shown in FIG. 3c) provide a high aspect ratio (e.g., height of approximately 470 nm; diameter of approximately 75 nm), which creates sufficient air space among the tips of the NR structures to generate a high fraction of the water/air interface (i.e., a large value for (1−w)) and therefore a large contact angle. In this way, the hierarchical structure provides self-cleaning characteristics that surpass that provided by NR only structures and HNW only structures.

Figure 6A:
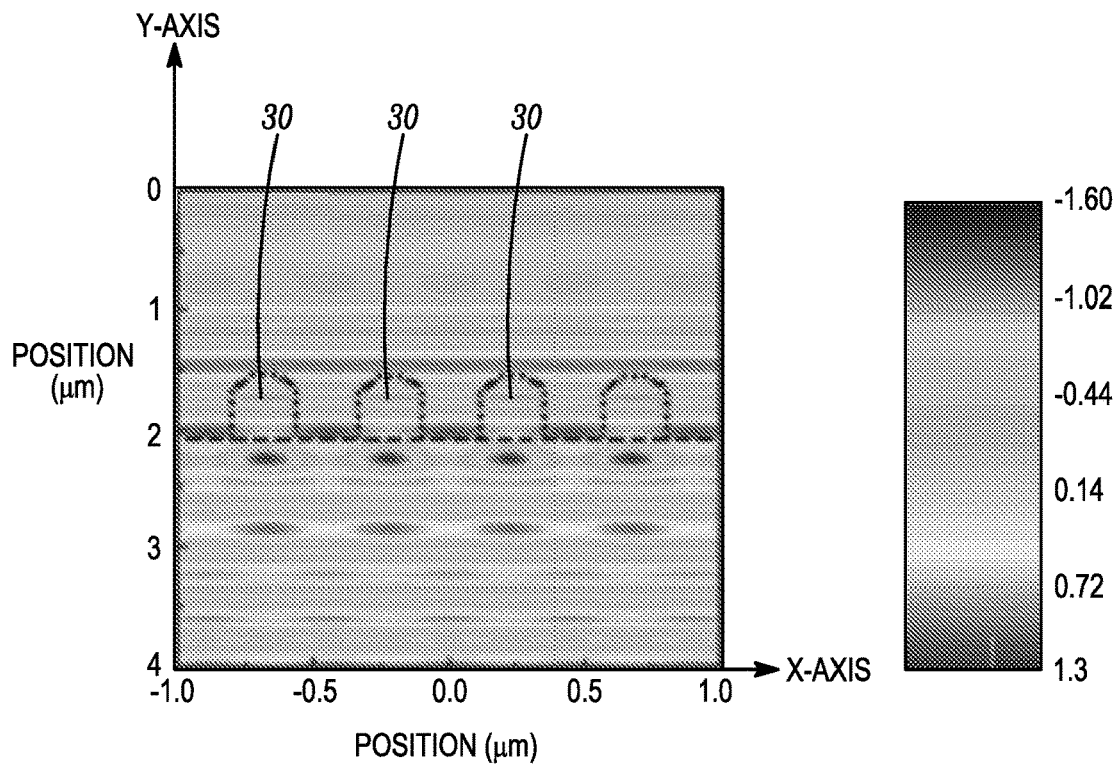
FIGS. 6a-6d are cross-sectional views of various surface structures, including the hierarchical nanostructure, overlayed with time-averaged transverse electric (TE)-polarized intensity distributions according to an embodiment of the present invention.
Figure 6B:
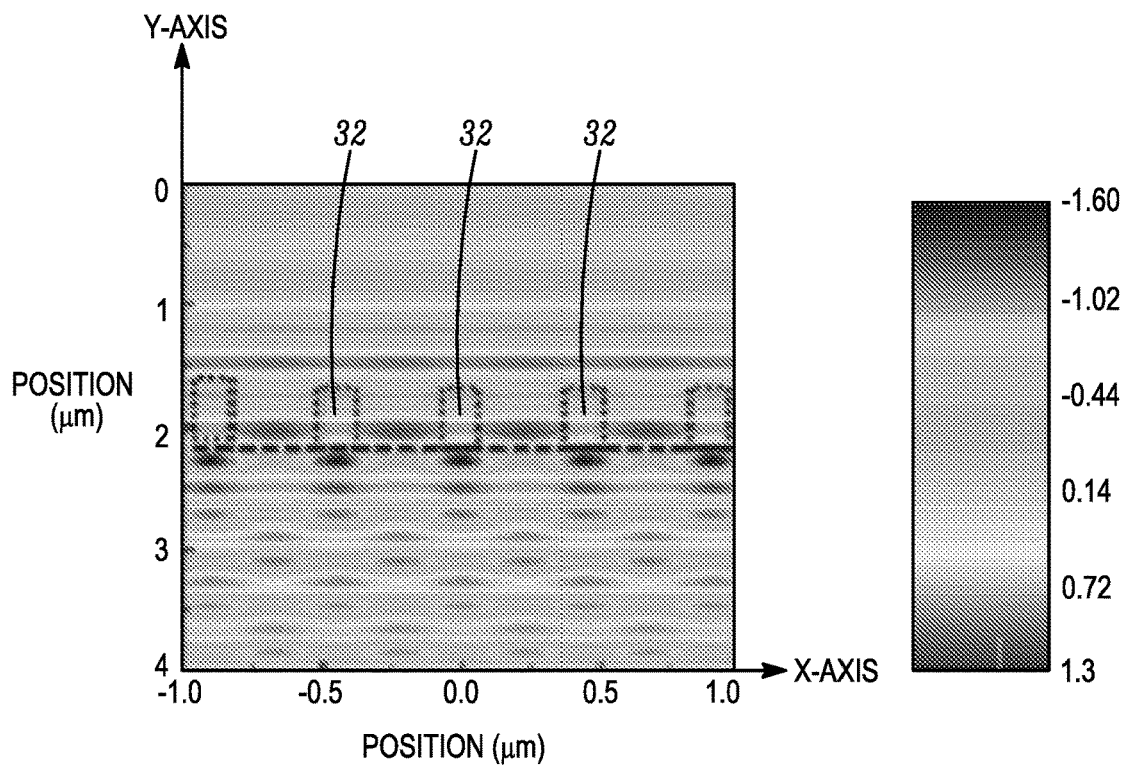
Figure 6C:
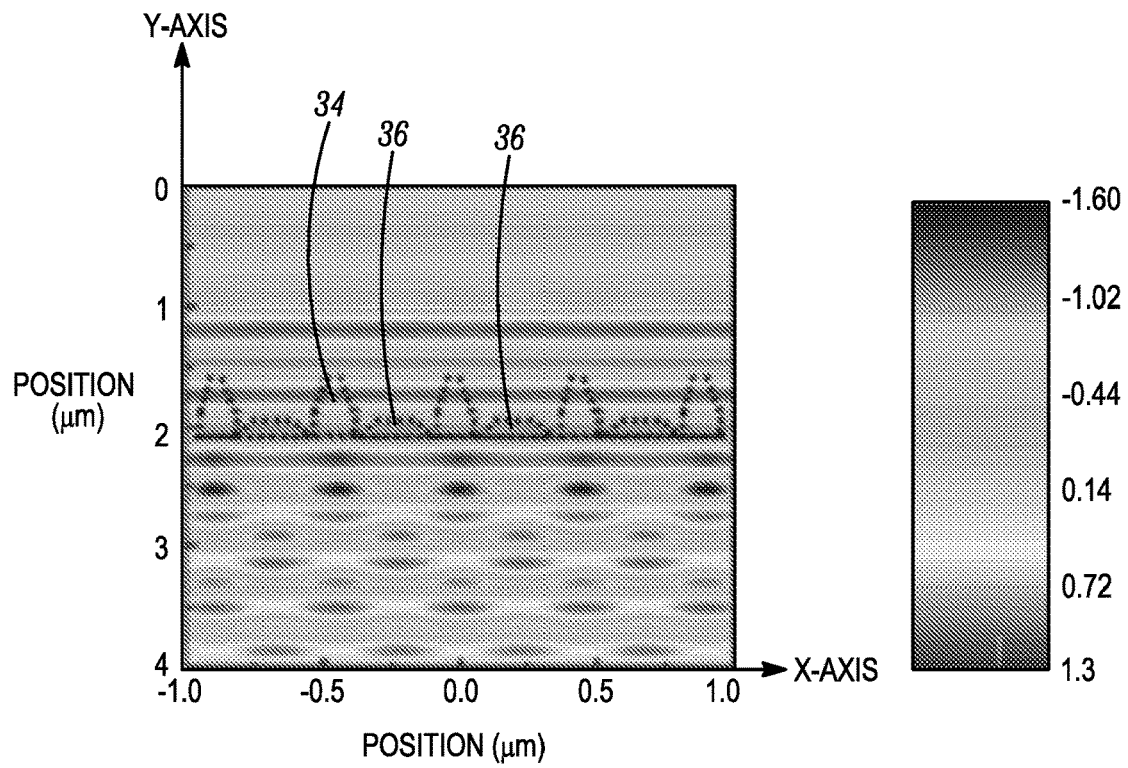
Figure 6D:
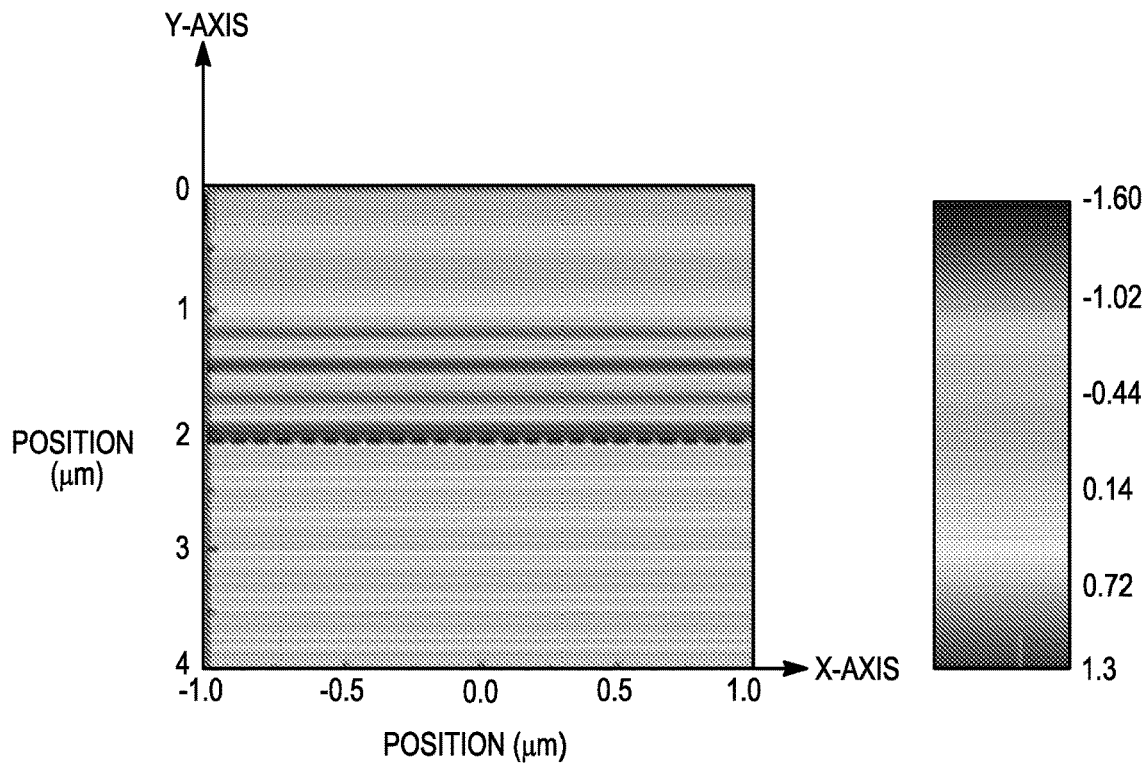

FIGS. 6a-6d are cross-sectional views of various structures, including NR structures, HNW structures, hierarchical nanostructure, and bare (no structures), respectively, overlayed with time-averaged transverse electric (TE)-polarized intensity distributions according to an embodiment of the present invention. Although the original TE-polarized intensity distributions were illustrated in color, the greyscale TE-polarized intensity distributions illustrate how the inclusion of nanostructures affects the TE-polarized intensity in both the x-direction and the y-direction. In particular, in the embodiment utilizing planar or bare packaging glass (shown in FIG. 6d), the TE-polarized intensity distribution are dispersed only in the y direction. That is, the x direction shows very little variation, which indicates that the bare surface provides little to no scattering of incident light. In contrast, the TE-polarized intensity distributions provided in FIGS. 6a-6c to NR only surface structures 30, HNW only surface structures 32 and hierarchical structures (including both NR structures 34 and HNW structures 36) illustrates periodic wave ripples in both the vertical direction (y direction) and horizontal direction (x direction), indicating that the nanostructures behave as effective scattering centers. In particular, the hierarchical structure shown in FIG. 6c provides the most dramatic response, with clear periodic ripples provided in the horizontal direction. As a result of the scattering reflections provided by the hierarchical structure, the TE-polarized intensity in the region bounded from y=0 µm (the interface between the hierarchical nanostructures and the packaging glass substrate 24) toy=1 µm on the vertical axis is lower than the bare glass structure shown in FIG. 6d.

Figure 7A:
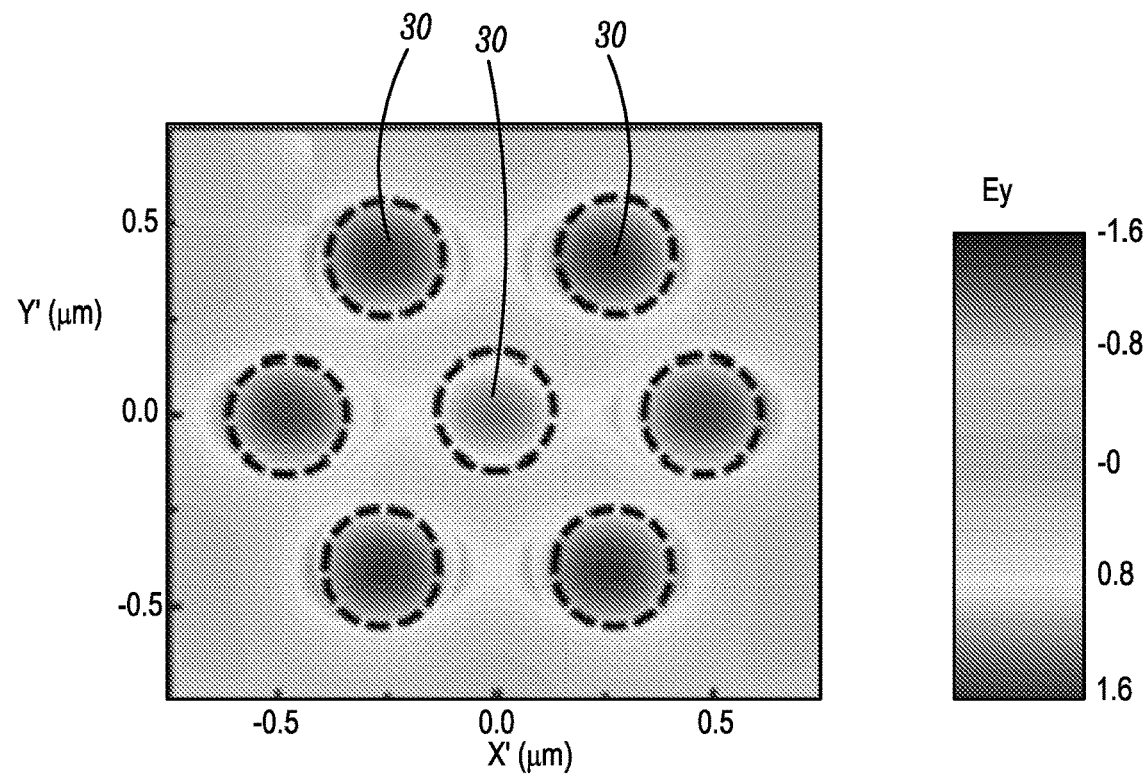
FIGS. 7a-7c are plan views of various surface structures, including the hierarchical nanostructure, overlayed with time-averaged transverse electric (TE)-polarized intensity distributions according to an embodiment of the present invention.
Figure 7B:
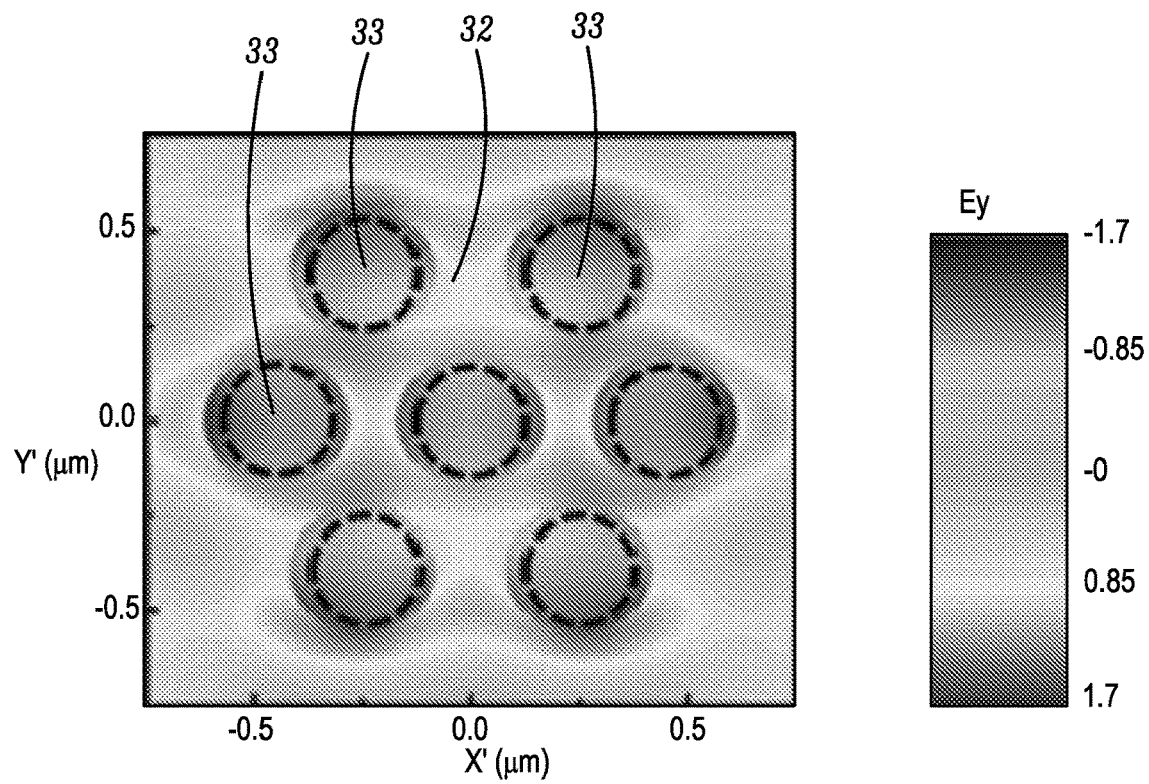
Figure 7C:
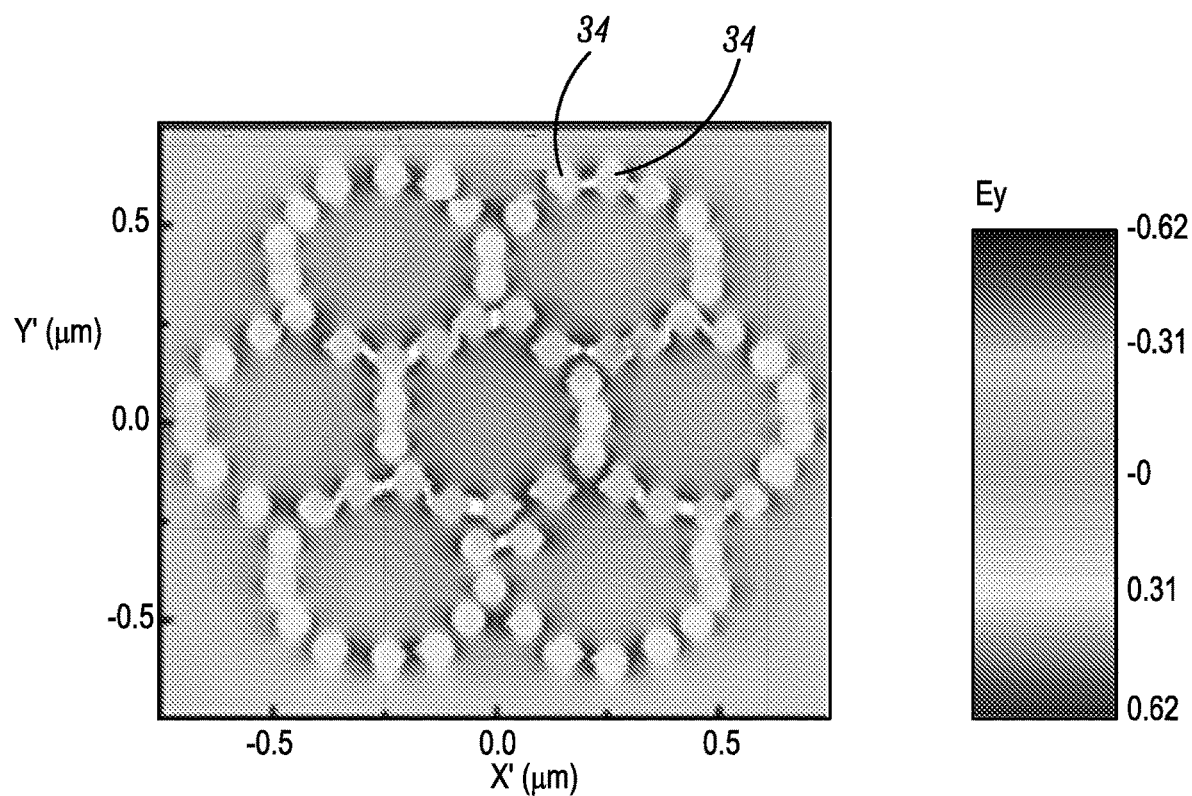
Figure 7D:
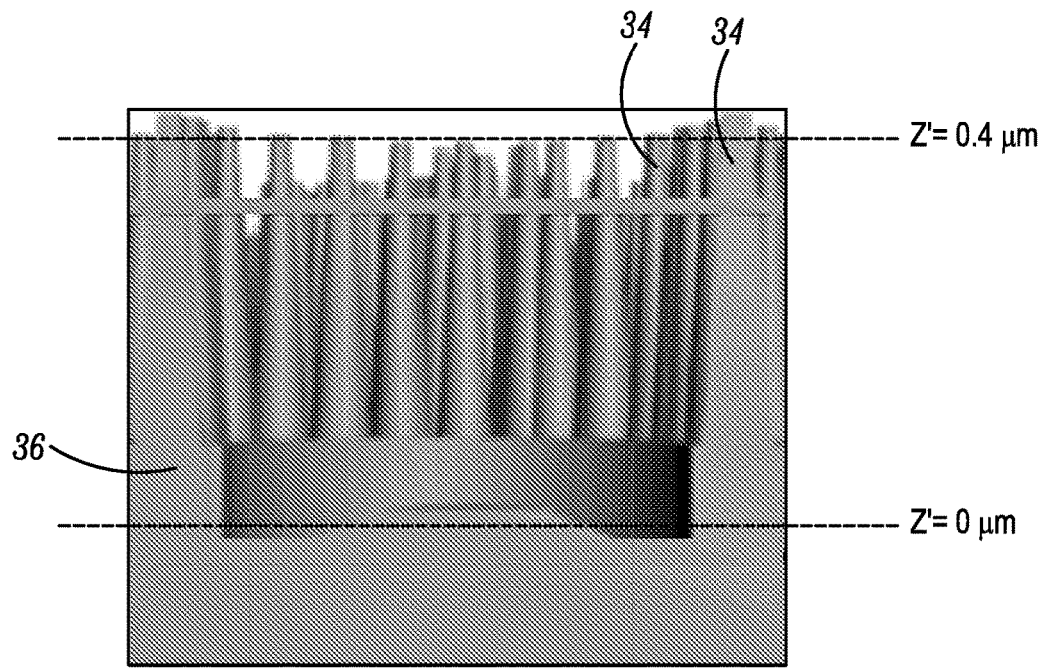
FIG. 7d illustrates a cross-sectional side view of the hierarchical nanostructure.

FIGS. 7a-7c are plan views of various structures, including NR structures, HNW structures, and hierarchical nanostructure, overlayed with time-averaged transverse electric (TE)-polarized intensity distributions. The TE-polarized intensity distributions were generated using a 3D finite-difference time-domain (FDTD) simulation, assuming an incident wavelength of 550 nm, and measured at a vertical height of z=0.4 µm (where z=0 µm corresponds to the position at the nanostructure/bulk interface, and wherein z=0.4 µm is approximately 100 nm below the air/nanostructure interface). In particular, FIG. 7a illustrates NR only structures, FIG. 7b illustrates HNW only structures, and FIG. 7c illustrates hierarchical structures. FIG. 7d illustrates a cross-sectional view of the hierarchical structure that relates the hierarchical structure to the z axis. FIG. 7d illustrates the hierarchical structure (including NR structure 34 and HNW structures 36). HNW structures 36 extend from position z'=0 µm.

With respect to the NR only structures 30 shown in FIG. 7a (indicated by the circular dashes), the shading within the circular dashes indicates that the TE-polarized intensity distribution is maximized within the NR structures themselves. In contrast, the HNW only structures 32 (defined by the circular nanoholes 33) shown in FIG. 7b illustrate a strong scattering effect around the sidewalls of the HNW 32, indicating that the HNW structures 32 trap incident light by forming scattering centers between the nanoholes 33.

The hierarchical structure shown in FIG. 7c illustrates a more uniform shading, indicating that the NR nanostructures 34 included as part of the hierarchical structure facilitates the transfer of waves into the lower HNW structures (not clearly visible in this view), which provide strong scattering as observed in the lower HNWs. As a result, more of the incident light is transferred to the active region 14. That is, the TE-polarized intensity distribution illustrated in FIG. 7c indicates that the hierarchical structure provides improved optical harvest as compared with other nanostructure surfaces.

Figure 8A:
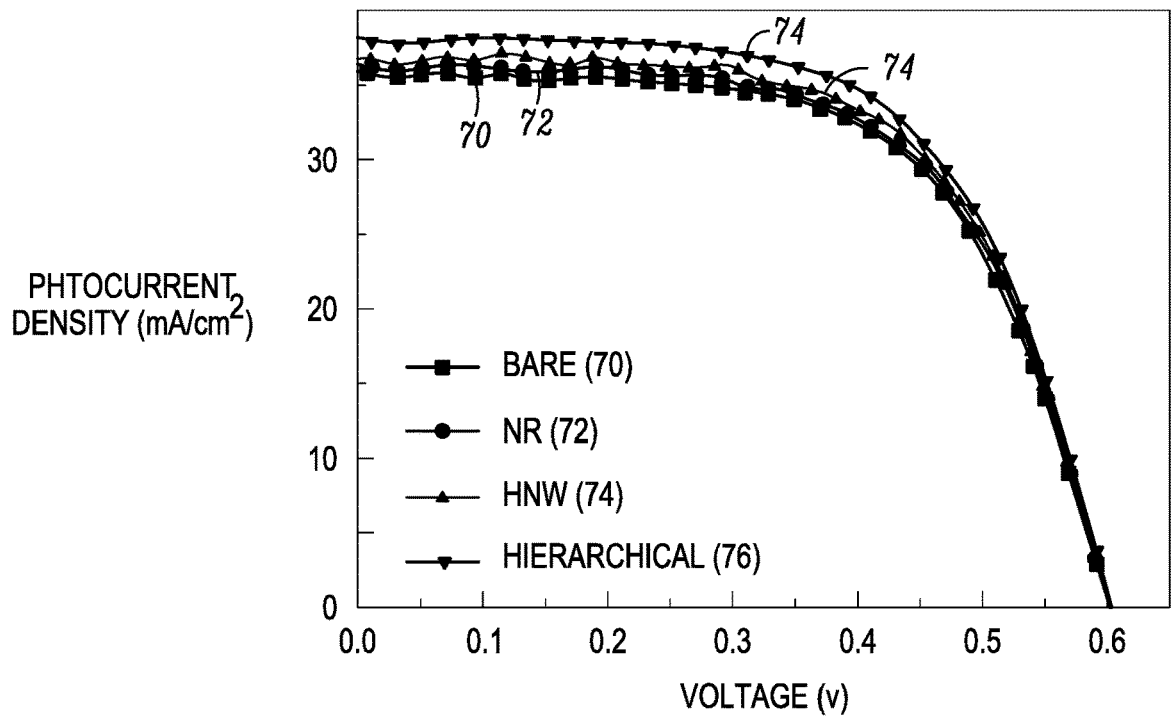
FIGS. 8a and 8b are graphs illustrating the photocurrent density and integrated daily power measured for solar cells utilizing various types of surface structures, including the hierarchical nanostructure according to an embodiment of the present invention.
Figure 8B:
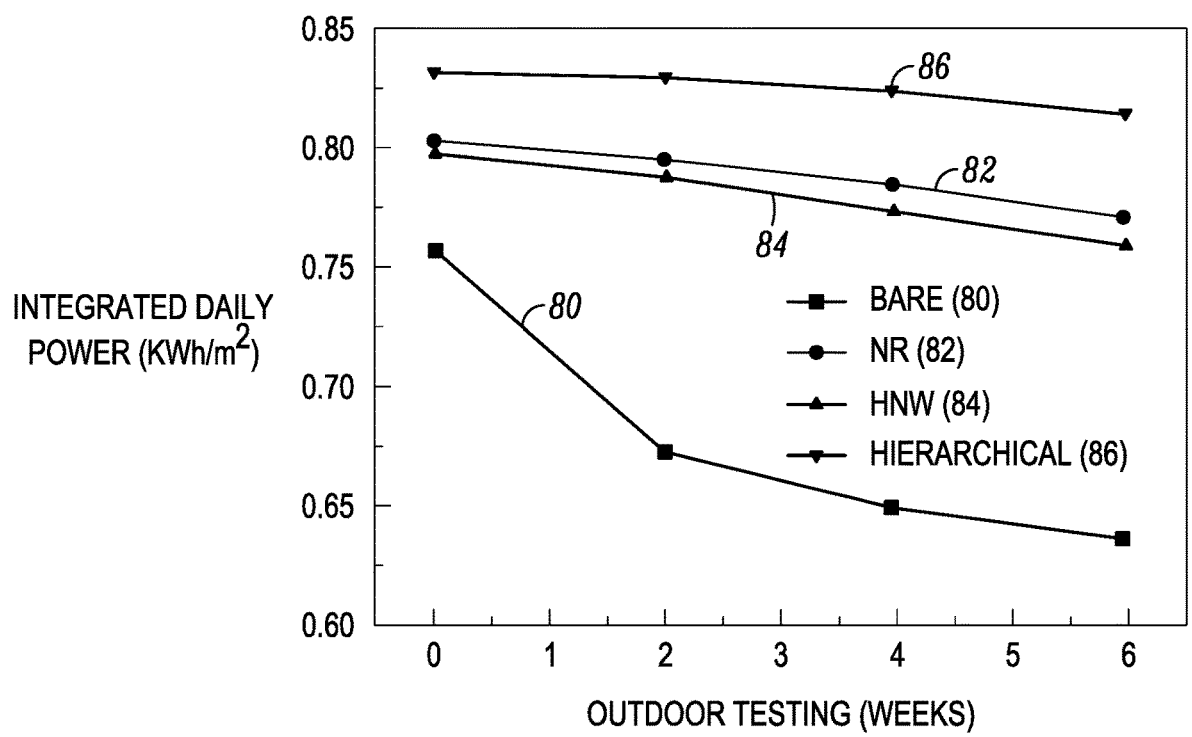

FIGS. 8a and 8b are graphs illustrating the photocurrent density and integrated daily power measured for solar cells utilizing various types of surface structures, including the hierarchical nanostructure according to an embodiment of the present invention. In particular, FIG. 8a compares the photocurrent density (mA/cm$^2$) of structures utilizing bare packaging glass (line 70), NR only surface structures (line 72), HNW only surface structures (line 74), and hierarchical surface structures (line 76). The results indicate that the hierarchical nanostructure provides the highest power conversion efficiency (PCE) (approximately 5.2% higher than that obtained with the bare glass). The increase in PCE observed with respect to the hierarchical structure is attributable, at least in part, to the enhance short-circuit current density ($J_{SC}$), which in turn is due to the superior optical transmittance ($T_{total}$) and haze.

In addition, FIG. 8b illustrates the self-cleaning capabilities of the hierarchical surface structure as compared with other surface structures. In particular, the y axis illustrates the integrated daily power generated by the power cell (estimated by summing the output power of the solar cell from 8 A.M. to 4 P.M.), while the x axis represents weeks spent outside. The ability to self-clean allows the surface of the packaging glass to remain relatively clear of dust/debris, which in turn allows a greater percentage of the incident light to reach the solar cells. As shown in FIG. 8b, the bare packaging glass (line 80) provides the worst self-cleaning capability, as integrated daily power drops sharply with each successive week. The NR only surface structure (line 82) and HNW only surface structure (line 84) provide improved performance over the bare packaging surface. However, the hierarchical structure (line 86) provides the best performance over the six week period, indicating that the hierarchical structure has superior self-cleaning capabilities as compared with both the NR only surface structure and the HNW only surface structure.

Figure 9A:
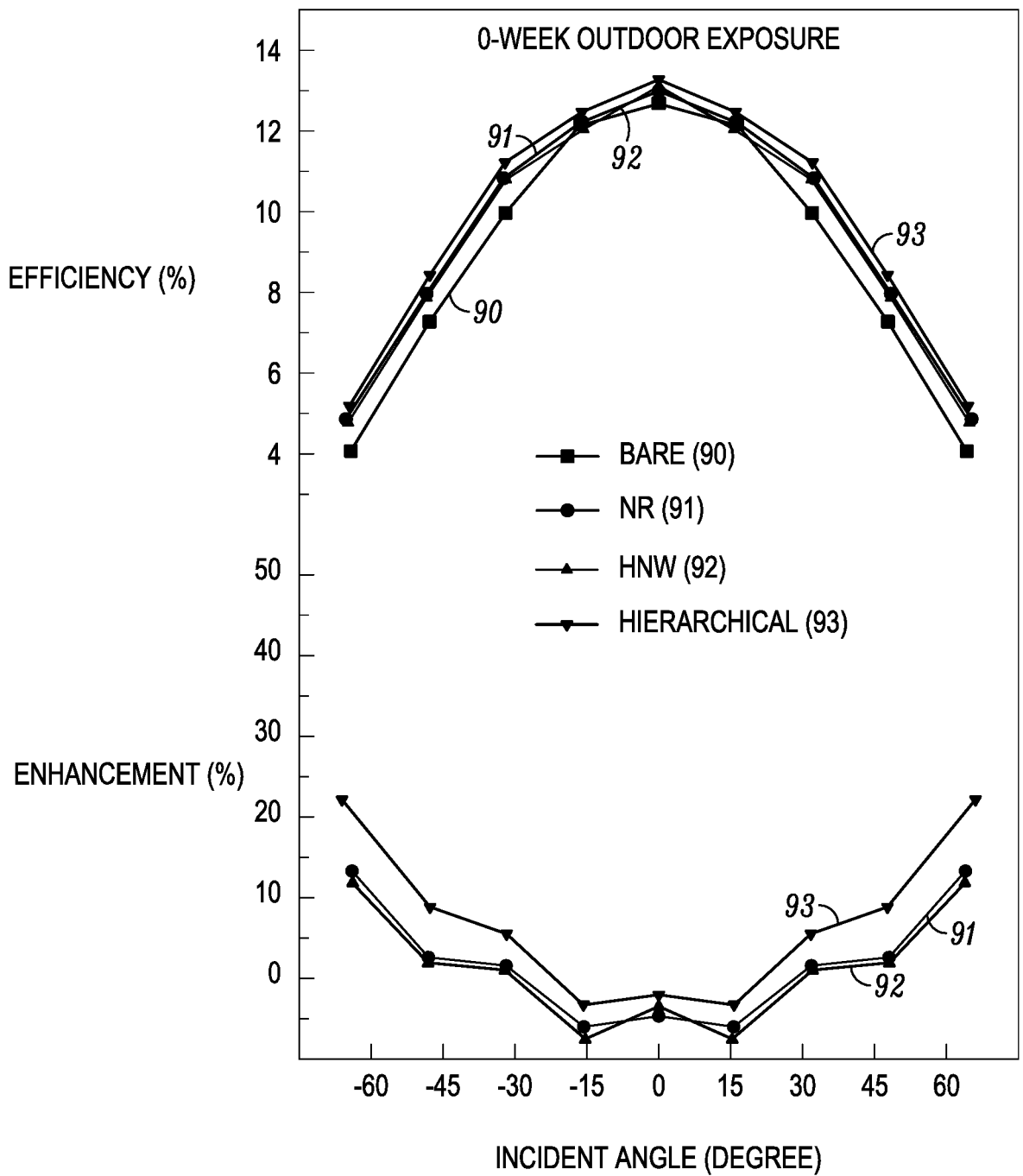
FIGS. 9a-9b are graphs illustrating the improved power conversion efficiency (PCE) achieved with the hierarchical nanostructure surface as compared with other surface structures according to an embodiment of the present invention.
Figure 9B:
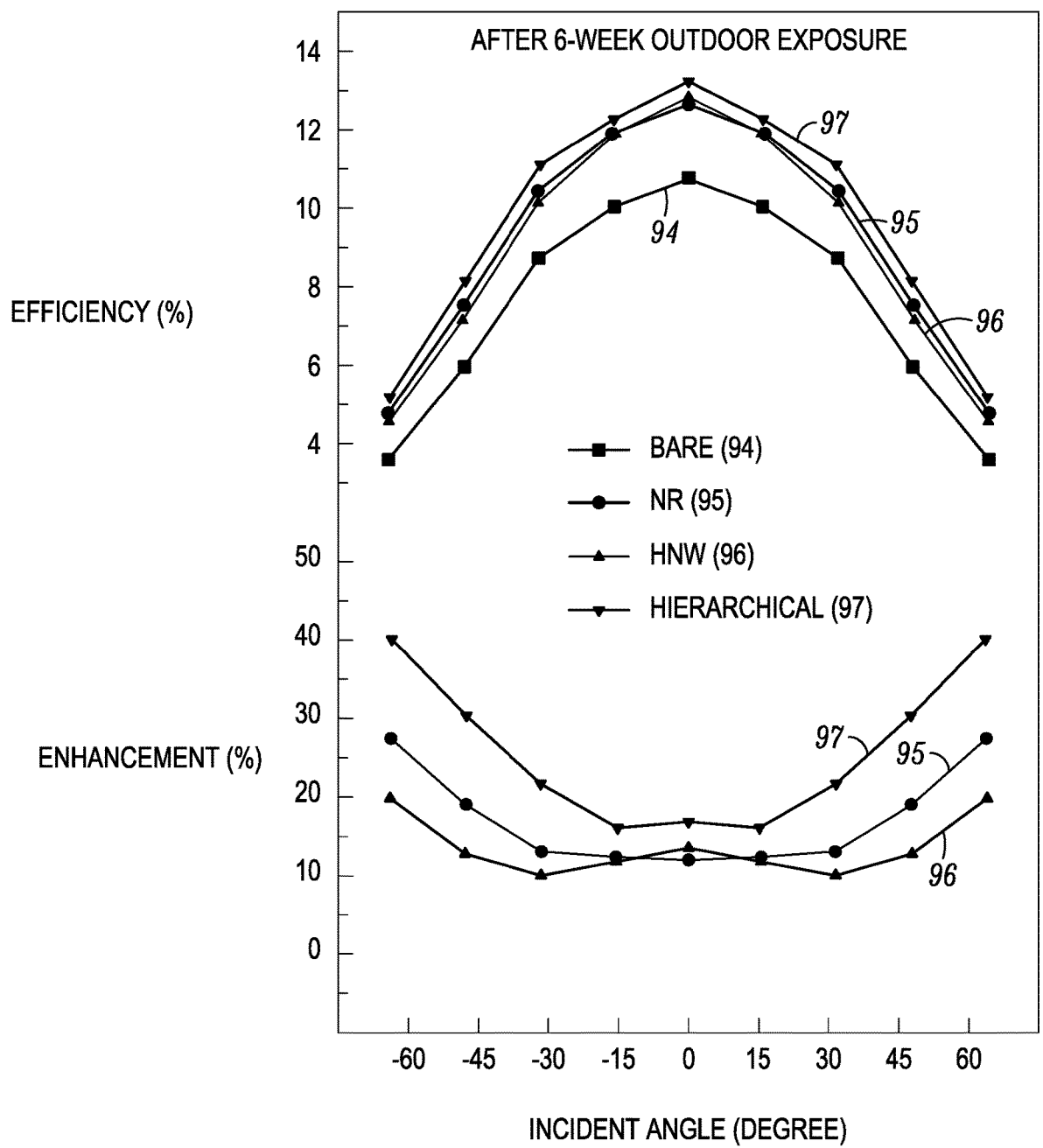

FIGS. 9a-9b are graphs illustrating the improved power conversion efficiency (PCE) achieved with the hierarchical nanostructure surface as compared with other surface structures according to an embodiment of the present invention. In particular, the top portion of FIG. 9a illustrates the PCE measured for each of the plurality of different types of packaging glass surface structures over a range of incident angles (−60° to 60°). The bottom portion of FIG. 9a illustrates the energy enhancement achieved by the various type of surface structures over the bare packaging glass at each of the plurality of incident angles. FIG. 9b represents the same information shown in FIG. 9a, respectively, but taken after six weeks of outdoor exposure to illustrate the self-cleaning capabilities of the hierarchical structure.

The portion of FIG. 9a illustrates that the highest PCE is provided by packaging glass utilizing the hierarchical surface structure (line 93) across each of the incident angles. The advantage of the hierarchical surface structure over other types of surface structures is highlighted in the bottom portion of FIG. 9a, which illustrates the enhancement provided by each of the various surface nanostructures over bare glass. In particular, while the hierarchical structure provides improved performance over bare glass and over the other surface nanostructures, the enhancement is particularly distinguished at high angles (from 5.2% at 0° to 27.7% at 60°). This indicates another benefit of the present invention, the ability to utilize incident light at various incident angles. Without the ability to utilize light at high angles of incidence, the position/orientation of the solar cell would need to be modified for different solar positions.

As shown in FIG. 9b, after a period of six weeks of outdoor use, the PCE provided by the hierarchical structure (line 97) as compared with bare packaging glass is even more pronounced than that shown in FIG. 9a. Due to the hydrophobicity of the hierarchical surface structure, dust and other particles are less adherent to the surface of the hierarchical structure than other structures, and in particular as compared with bare packaging glass. The enhancement in efficiency provided by the hierarchical structure over the bare packaging glass is illustrated in the bottom portion of FIG. 9b. Once again, the hierarchical surface structure provides the best performance, which is most distinguished at higher incident angles. In particular, the PCE enhancement achieved by the hierarchical glass is close to 46% at an angle of incident of 60°.

Figure 10:
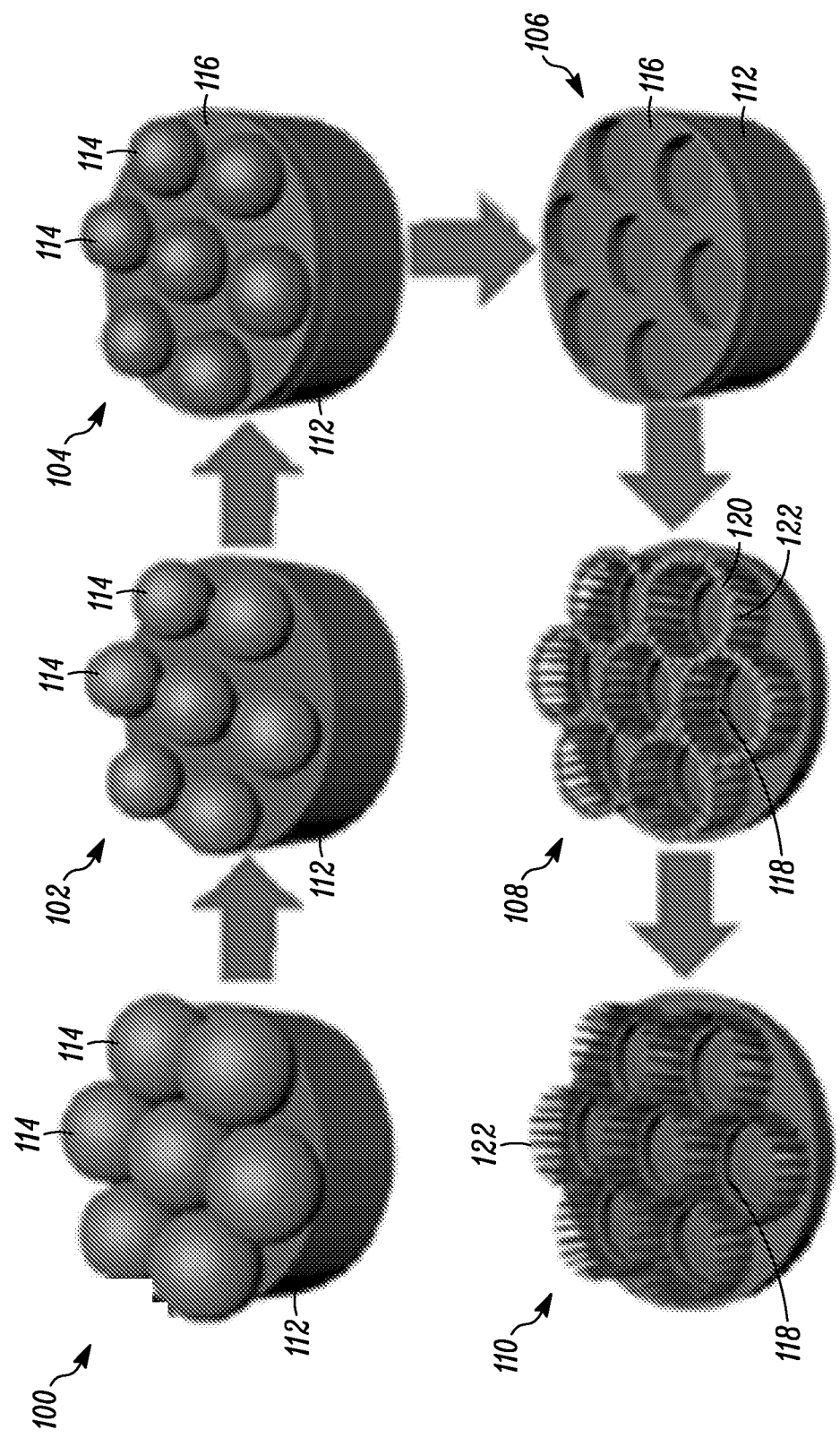
FIG. 10 illustrates a method of fabricating the hierarchical nanostructure according to an embodiment of the present invention.

FIG. 10 illustrates a method of manufacturing the hierarchical nanostructure according to an embodiment of the present invention. At step 100, the packaging glass substrate (i.e., fused-silica glass) 112 is dipped in a solution of suspended polystyrene (PS) nanospheres 114. In one embodiment, the PS nanospheres 114 have a diameter of approximately 450 nm, which self-assembly in a monolayer on the surface of packaging glass substrate 112.

At step 102, the PS nanospheres 114 are shrunk by application of an $O_2$ for a duration of time (e.g., 30 seconds) in the presence of a determined coil power (e.g., 50 W) and at a determined chamber pressure (e.g., 5 Pa). Shrinking the PS nanospheres 114 at step 102 creates space between the spheres for subsequent etching processes. In particular, the space created between adjacent nanospheres defines the width of the nanowall (HNW) structure fabricated in subsequent steps.

At step 104, in preparation to fabricate the hierarchical surfaces, the packaging glass substrate 112 and shrunk PS nanospheres 114 are coated with a silver (Ag) coating 116 via an e-beam evaporation process. In one embodiment, the Ag coating 116 has a thickness of approximately 160-200 nm. The coating 116 results in coating of nanospheres 114 and portions of the substrate 112 not covered by nanosphere 114.

At step 106 the PS nanospheres 114 are removed, leaving circular patterns of exposed packaging glass substrate 112, surrounded by a honeycomb structure of Ag coating 116. In one embodiment, Tetrahydrofuran (THF) is utilized to remove the PS nanospheres 114.

At step 108, an etching process—such as a reactive ion etch (REI)—is utilized to selectively etch the packaging glass substrate 112 and the Ag coating 116. The etching removes some of the packaging glass substrate material 112 within the circular regions, thereby creating the honeycombed nanowall (HNW) structures 118. In addition, etching of the Ag layer results in the Ag coating or film 116 evolving into Ag islands 120 during the RIE process. The Ag islands 120 act as a mask for the remaining etching process, leading to ultrathin nanorod structures 122 being formed on top of the HNW structures 118.

At step 110, residual Ag is removed, leaving the desired hierarchical structure comprised of HNW structures 118 and nanorod structures 122 formed on the packaging glass substrate 112. In embodiments in which packaging glass substrate is comprised of silicon oxide ($SiO_2$), then the NR structures 122 and HNW structures 118 are also formed of silicon oxide ($SiO_2$). In one embodiment, residual Ag is removed using nitric acid. In addition, having removed residual Ag, the resulting hierarchical structure is immersed in OTMS ethanol solution for a period of time (e.g., 10 hours), followed by rinsing of the structure with DI water and dried with nitrogen ($N_2$).

In this way, the present invention provides an optical device that utilizes a packaging glass with a hierarchical surface structure. In particular, the hierarchical surface structure utilizes a honeycombed nanowall (HNW) structure, the top of the HNW structures having nanorod (NR) structures extending away from the HNW structures. The hierarchical structure provides an effective medium with a smooth index transition from air to the packaging glass, as well as an effective scattering center to facilitate capture of sunlight from a wide range of incident angles. In addition, and perhaps most importantly, the hierarchical surface structure provides superior self-cleaning capabilities (i.e., prevents particles from adhering to the surface of the packaging glass).

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An optical device comprising:
   an active region; and
   a packaging glass located adjacent to the active region to transmit incident light to the active region, wherein a surface of the packaging glass opposite the active region includes hierarchical nanostructures comprised of honeycombed nanowalls (HNWs) and nanorod (NR) structures extending from the HNWs.

2. The optical device of claim 1, wherein the optical device is a solar cell.

3. The optical device of claim 1, wherein a combined height of the HNWs and NR structures extending from the HNWs is approximately 470 nanometers (nm).

4. The optical device of claim 1, wherein the packaging glass and the HNWs and NR structures comprise fused-silica.

5. The optical device of claim 1, wherein the hierarchical nanostructure surface is characterized by a surface hydrophobicity that is greater than a surface hydrophobicity of a flat surface.

6. The optical device of claim 5, wherein surface hydrophobicity of the hierarchical nanostructure is measured with a sessile drop method in which a droplet of water is placed on the surface and a contact angle is measured between the droplet of water and the hierarchical nanostructure surface of the packaging glass, wherein the hierarchical nanostructure surface provide a contact angle of greater than 104°.

7. The optical device of claim 6, wherein the hierarchical nanostructures provide a contact angle of approximately 124°.

8. A method of fabricating hierarchical nanostructures onto a packaging glass surface, the method comprising:
   depositing nanospheres on the packaging glass surface;
   coating the packaging glass surface, including the nanospheres, with a coating layer;
   removing the nanospheres from the packaging glass surface to expose uncoated portions of the packaging glass surface, wherein the coating layer acts as a first mask layer;
   conducting a first etching operation to etch the exposed uncoated portions of the packaging glass surface to create honeycombed nanowalls (HNWs) on the packaging glass surface, wherein the etching process also etches the coating layer to create coating islands on top of the HNWs, wherein the coating islands act as a second mask layer;
   conducting a second etching operation to etch exposed uncoated portions surrounding the coating islands to create nanorod (NR) structures on top of the HNWs.

9. The method of claim 8, wherein the nanospheres are polystyrene nanospheres.

10. The method of claim 8, wherein prior to coating the packaging glass surface the deposited nanospheres are shrunk to create a desired amount of space between adjacent nanospheres, wherein the space between adjacent nanospheres determines widths of the HNWs.

11. The method of claim 8, wherein the coating layer is silver (Ag).

12. The optical device of claim 1, wherein light incident on the optical device passes through the active region before interacting with the active region.

13. The optical device of claim 1, wherein the HNWs are defined by a height and a thickness, wherein the height of the HNWs is greater than the thickness of the HNWs.

14. The optical device of claim 13, wherein the height of the HNWs is equal to or greater than twice the thickness of the HNWs.

15. The optical device of claim 1, wherein the NR structures are defined by a diameter and a height, wherein the height of the NR structure is greater than the diameter of the NR structure.

16. The optical device of claim 15, wherein the height of the NR structure is equal to or greater than twice the diameter of the NR structure.

* * * * *